United States Patent [19]

Baird et al.

[11] 4,451,540
[45] May 29, 1984

[54] SYSTEM FOR PACKAGING OF ELECTRONIC CIRCUITS

[75] Inventors: Phillips C. Baird, Lakeville; Raymond J. Duff, South Dartmouth, both of Mass.

[73] Assignee: Isotronics, Inc., New Bedford, Mass.

[21] Appl. No.: 413,169

[22] Filed: Aug. 30, 1982

[51] Int. Cl.³ .......................................... H01L 23/02
[52] U.S. Cl. .............................. 428/615; 174/52 FP; 357/74
[58] Field of Search ...................... 428/544, 615, 618; 174/52 FP, 50.61, 50.56, 16 HS; 29/588; 228/179; 357/74

[56] References Cited

U.S. PATENT DOCUMENTS

| | | | |
|---|---|---|---|
| 1,996,721 | 4/1935 | Gibbs | 428/618 |
| 3,351,700 | 11/1967 | Savolainen et al. | 174/50.56 |
| 4,227,036 | 10/1980 | Fitzgerald | 174/16 HS |
| 4,262,300 | 4/1981 | Scherer | 357/74 |
| 4,266,089 | 5/1981 | Scherer | 174/52 FP |
| 4,266,090 | 5/1981 | Scherer | 174/52 FP |

OTHER PUBLICATIONS

Metals Handbook, 8th Ed., vol. 6, p. 605, Aug. 1971.

Primary Examiner—L. Dewayne Rutledge
Assistant Examiner—S. Kastler
Attorney, Agent, or Firm—Weingarten, Schurgin, Gagnebin & Hayes

[57] ABSTRACT

A brazing technique is described for providing a standard flat pack with a Thermkon base brazed to a Kovar frame through the utilization of an intermediary ring of high thermal conductivity material which prevents flashing onto the Thermkon base. Brazing is accomplished either in a one-step process in which the parts with the intermediary ring are brazed together all at one time with a single heat treatment, or in a two-step process in which the intermediary ring is first brazed to the frame. In a subsequent step, the frame with the intermediary ring brazed thereto, is brazed to the Thermkon base. In either process, the high thermal conductivity of the intermediary ring permits the ring to quickly reach brazing temperature for minimizing flashing.

8 Claims, 6 Drawing Figures

SYSTEM FOR PACKAGING OF ELECTRONIC CIRCUITS

FIELD OF INVENTION

This invention relates to the packaging of electronic circuits, and more particularly a brazing technique in which flashing is avoided when a base having an exceptionally high thermal conductivity is to be brazed to a frame which has a lower thermal conductivity.

BACKGROUND OF THE INVENTION

The packaging of high power transistors and electronic components which generate considerable heat, requires a package having a high thermal conductivity base to act as an efficient heat sink. In order to accommodate high power integrated circuits, a flat packaging technique is utilized in which a rectangular metal frame is hermetically-sealed to a metal base, with the leads to the integrated circuit being provided through the generally rectangular frame. The integrated circuit is mounted to the base and is sealed to the base and frame after appropriate wire bonding to form the final package. In general, the rectangular frames are made of Kovar, a trademark of Westinghouse Electric Corporation, which is utilized because of the ease with which glass-bonded leadthroughs may be provided. Kovar is a glass sealing alloy of 29% nickel, 17% cobalt, and 54% iron by weight. Other glass sealing alloys include Alloy 42 manufactured by Carpenter Technology Corporation and contains 41% nickel and 59% iron.

In the past, Kovar has been bonded to a metal base, usually Kovar or molybdenum. However, with the recent development of a copper-infiltrated tungsten material manufactured by C.M.W. Inc. of Indiannapolis, Ind., called Thermkon, it has been desirable to utilize the Thermkon as a base for the standard flat package. Thermkon is an alloy of 75% tungsten and 25% copper by weight. The reason that Thermkon is exceptionally useful as a base for flat packages is its extremely high thermal conductivity and the fact that its temperature coefficient of expansion is matched to that of beryllium oxide which is a commonly used substrate for high power transistors and integrated circuits. Moreover, the Thermkon exhibits good stiffness to acceleration forces and therefore provides an exceptionally stable hermetically sealable package.

Prior to the advent of Thermkon, in order to achieve the type of hermeticity required, a nickel-plated beryllium oxide base was used to which a Kovar frame was brazed. However, the cost of providing beryllium oxide bases is prohibitive. With the advent of Thermkon, it was deemed that a suitable base material had been found. However when bonding Thermkon to Kovar, it was found that the braze used to bond the Kovar to the Thermkon flashed over the Thermkon base and resulted in a poor Thermkon/Kovar bond. Flashing results because the thermal conductivity of the Thermkon is much higher than that of Kovar. During processing, once heat is applied, the Thermkon reaches the brazing or eutectic temperature of the braze faster than the Kovar. The result is that the bottom surface of the braze which is in contact with the Thermkon melts before the top surface which is in contact with the Kovar. Because the bottom surface is melted when the top surface is not, the braze runs out uncontrollably over the Thermkon prior to the Kovar reaching the brazing temperature. As a result, there is very little braze material left when the Kovar finally reaches the brazing temperature and a reliable bond cannot be achieved. The runout of braze material is called flashing, which is both cosmetically unacceptable and which can cause leaching out of substances from the base, especially if the temperature must be raised to achieve a bond to the Kovar.

Thus, while brazing can be accomplished to both Kovar and Thermkon at 780° C. for a braze which melts at 780° C., problems occur due to the higher thermal conductivity of the Thermkon. When attempting to braze Kovar directly to Thermkon, it was thought that raising the initial temperature 100° C. would quicken the Kovar reaching 780° C., and that this would occur before all of the braze flashed out. However, this 100° C. difference in temperature nonetheless results in uncontrollable flow of the braze material over the Thermkon.

While it is possible to bond Thermkon to Kovar with a low temperature brazing alloy, the use of the low temperature alloy restricts the temperature to which the package can then be subjected during further processing. For instance, when using the low temperature brazing technique, conventional soldering or bonding can loosen or destroy the bond between the Thermkon and the Kovar.

It should be noted that it is difficult to bond other glass sealing alloys to high thermal conductivity bases for the same reasons mentioned above. It is therefore imperative to provide a high temperature brazing system in which good bonds are achieved and in which flashing is minimized.

SUMMARY OF THE INVENTION

In order to permit the brazing of lower thermal conductivity material to higher conductivity material, an intermediary material having a thermal conductivity higher than the lower thermal conductivity material is placed between the two parts to be brazed so that the braze between the higher thermal conductivity material and the intermediary material melts throughout at substantially the same time. For flat pack applications, when the higher thermal conductivity material is a Thermkon base and the lower thermal conductivity material is a Kovar frame, a copper ring of the same cross-sectional shape as the frame is placed between the frame and the base. A conventional preform braze ring is placed at the Kovar-copper ring interface, and the same type preform braze ring is placed at the copper ring-Thermkon interface. The sandwich structure thus formed is then subjected to a single heat treatment step in which the sandwich structure is raised to a temperature above the temperature at which both brazes melt. This is relatively high temperature such as 780° C. for the preform braze which melts at this temperature. The result is that the molten braze is retained at the ring-Thermkon interface by capillary action. The brazed sandwich is then cooled below the melting temperature of the braze. Capillary action is permitted to work because all parts of the braze are raised to the melting temperature at very nearly the same time. This prevents the top surface of the braze which rests on the Thermkon, from remaining below the braze melting temperature as the bottom surface melts and thus flashing is minimized.

In an alternative embodiment, the frame is first brazed to the Kovar frame through the use of a preform braze at a temperature of, for instance, 780° C. After the copper ring has been brazed to the frame, the composite structure is brazed at the same or lower temperature to the Thermkon base, again with a preform braze. In both embodiments, the ring and Thermkon may be first coated with nickel when a silver braze is used.

Copper is used because it is readily brazed to Kovar and because its thermal conductivity matches or exceeds that of Thermkon so that it reaches the brazing temperature either before or simultaneously with the Thermkon. During brazing, the braze melts equally onto the copper and Thermkon and is held at the seam by capillary retention at both parts. Were there no immediate bond to the copper, the melted braze would not be retained at the seam, but rather would run laterally. If the copper reaches the braze temperature first, there will be some flashing onto the copper, but this is not critical since very little braze will be removed from the seam line by the relatively small cross-sectional extent of the copper ring. This means that the copper/Thermkon seam will be reliable, since very little flashing will occur.

It will be noted that the above techniques work equally well with a number of glass sealing alloys such as Alloy 42 which has a low thermal conductivity even lower than Kovar.

While the thermal conductivity of the intermediate ring is preferably equal to or greater than that of the high thermal conductivity material, improved results can be achieved if the thermal conductivity of the ring is intermediate that of the parts to be joined, as long as it is higher than that of the lower thermal conductivity material.

While acceptable results with respect to flashing are achieved by this method, in a preferred embodiment, a channel is provided interior to the inside dimension of the ring/frame composite. This channel acts as a braze stop which prohibits any small flow of the brazing material from running onto the surface of the base.

The use of the intermediary ring conforming in shape to the dimensions of the frame permits the bonding of two materials which heretofore could not be successfully bonded.

With respect to the above-mentioned two step process, this process also solves the problem of flashing over the higher thermal conductivity material. One further explanation for the success of the two step process is that the high thermal conductivity heat sink is eliminated during half of the process. In the first step, it is not critical if the brazing material flashes over the copper. Thus the copper-to-Kovar brazing step can involve temperatures in excess of 780° C. Of course, high temperatures need not be used since the Thermkon heat sink which necessitates high temperature processing is removed at this time. More critical temperature control is required with respect to the bond to the Thermkon to prevent flashing. Because of the use of the intermediary ring, temperature during this step can be controlled without regard to the previous braze to the Kovar. The result is that flashing is dramatically reduced and can be controlled due to the independence of the two sets of brazing conditions afforded by the intermediary ring.

BRIEF DESCRIPTION OF THE DRAWINGS

These and other features of the subject invention will be better understood in connection with the detailed description taken in conjunction with the drawings of which.

DETAILED DESCRIPTION

Figure 1:
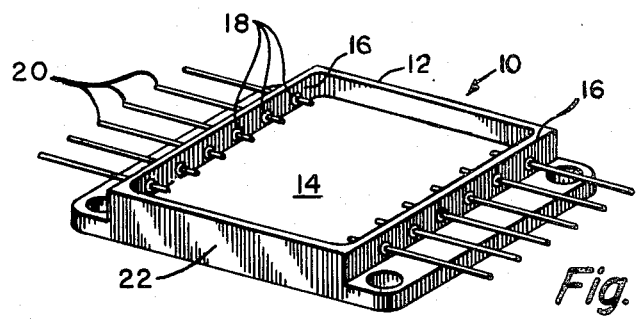
FIG. 1 is an isometric view of a standard flat pack for the packaging of electronic circuits.

As illustrated in FIG. 1, a flat pack 10, in general includes a frame 12 and a base 14 with the upstanding walls 16 of frame 12 having glass feedthroughs 18 to permit the passage of leads 20 through the frame to the interior of the flat pack. The flat pack as illustrated is formed with gold plating 22 over the structure comprising the base and the frame, prior to passing leads 20 through the frame in a conventional manner.

Figure 2:
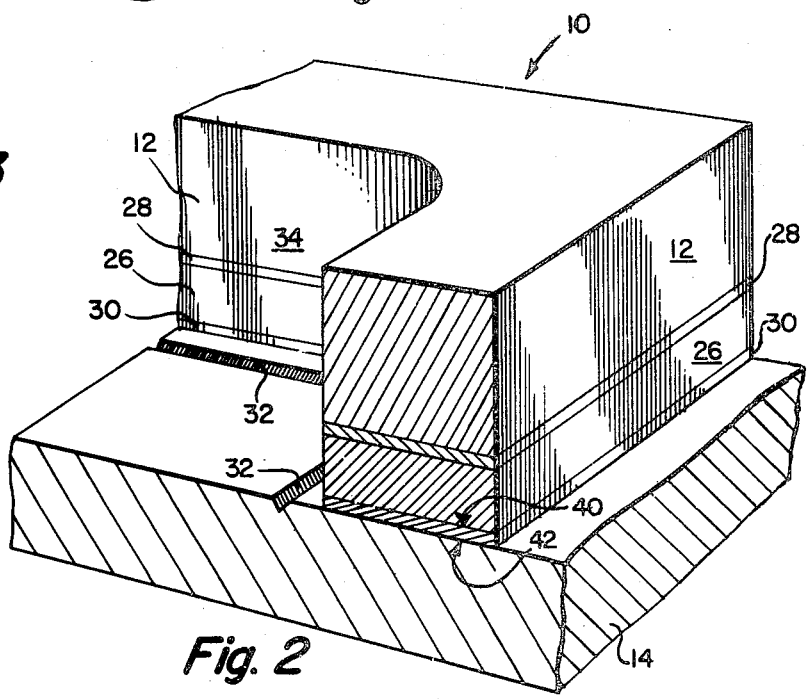
FIG. 2 is a cross-sectional and diagrammatic illustration of a portion of a flat pack constructed in accordance with the teachings of the subject invention, illustrating the utilization of an intermediary ring between a frame and a base, and also illustrating an interior annular channel used as a braze stop.

Referring now to FIG. 2, the standard flat pack is modified to include an intermediary ring 26 positioned between frame 12 and base 14. Ring 26 has the same cross-sectional configuration as that of the frame and in one embodiment is 0.015" in thickness. In this embodiment, the Kovar frame is 0.135" in thickness. A preform braze 28 in ring form is positioned between frame 12 and ring 26 and has the same cross-sectional configuration as the ring and frame. In one embodiment, the preform braze is 72% silver, 28% copper with a eutectic or melting temperature of 780° C. and a thickness of 0.003". Between ring 26 and base 14 is another preform braze 30, again matching the cross-sectional configuration of frame 12. This preform braze may be identical to braze 28 or may be specially tailored to the base-ring characteristics. In this embodiment, the Thermkon base has a thickness of 0.060". In a preferred embodiment, base 14 is provided with an interior annular groove or channel 32 which is positioned just inside the interior surface 34 of the frame-braze-ring combination.

In order to provide the composite structure illustrated at FIG. 2, this structure prior to heat treating is placed in a furnace set at, for instance, a temperature of 900° C. which translates to a temperature of 780° C. at the working zones of the furnace. In one embodiment the furnace is a BTU Model TH43-354E-54F furnace having three zones, with the belt speed of the furnace being set at 10" per minute. The total processing time is thus approximately 6 minutes. A nitrogen atmosphere for the furnace is provided at 50 liters per minute in all zones. After the composite sandwich structure passes through the furnace, the structure is cooled to a point below the melting point of the brazes.

It will be appreciated that Kovar has a thermal conductivity (cal/cm$^2$.sec. °C./cm) of 0.1, whereas copper has a thermal conductivity of 0.9, and Thermkon has a thermal conductivity of 0.6. It will thus be seen that the thermal conductivity of the copper equals or exceeds that of the Thermkon such that the ring and the base reach the same temperature substantially at the same time. As mentioned hereinbefore, it is not critical that the copper reaches the 780° C. processing temperature before that of the Thermkon, since flashing onto the copper ring is not critical. By virtue of the utilization of the ring which has a thermal conductivity higher than that of the frame, preform braze 30 is melted at its top and bottom surfaces, respectively 40 and 42, at approximately the same time, such that when the braze starts to flow, it is held to the dimension of the bottom portion of the ring by capillarity. This is in contradistinction to the utilization of a frame of lower conductivity type bonded directly to the base, in which case the top surface 40 of the braze would not melt at the same time that the bottom surface of the braze melts. The result, as mentioned hereinbefore, is that the braze spreads out over the base causing unacceptable flashing.

Annular groove 32 is used as a braze stop to prevent any small amounts of braze from spreading onto the majority of the base, although its use may be omitted with careful temperature control of the brazing process.

Figure 3:
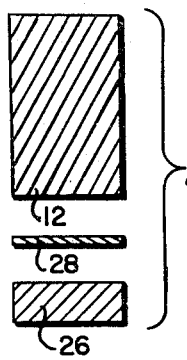
FIG. 3 is an exploded view and cross-sectional diagram of a portion of frame, preform braze, and ring prior to brazing.
Figure 4:
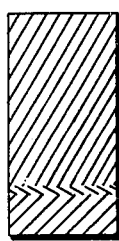
FIG. 4 is a cross-sectional diagram of the composite frame and ring of FIG. 3 as brazed.

Referring now to FIG. 3, a two-step process may be utilized in forming the flat pack in which frame 12, preform braze 28, and ring 26 are sandwiched together as illustrated in FIG. 3, and are formed as a unit as illustrated in FIG. 4 by reference character 50. In this two-step process, the furnace temperature is maintained at 780° C. utilizing the same furnace as mentioned above. The above speed is again 10" per minute and the atmosphere is introduced at 50 liters per minute to all zones of the furnace.

Figure 5:
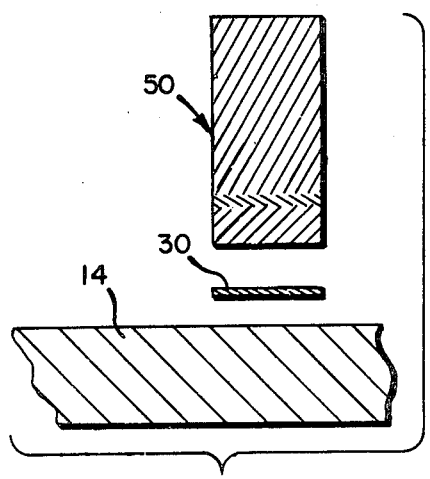
FIG. 5 is an exploded view and cross-sectional diagram of the composite frame and ring of FIG. 4 and preform braze, and base prior to brazing of the composite to the base; and, FIG. 6 is an isometric view of the finished flat pack prior to final plating.

As illustrated in FIG. 5, composite 50 is positioned over preform braze 30 and base 14. When these parts are in intimate contact, they are again processed in a second step under the same operating conditions noted above.

In order to increase the reliability of the bond between all of the parts, it is oftentimes desirable to plate the ring and base with a nickel coating usually on the order of 0.0002". Alternatively, it has been found that it is not necessary to plate the copper ring. As will be appreciated, Kovar includes a not inconsiderable amount of nickel which aids in the bonding of a nickel-plated ring to the Kovar.

Figure 6:
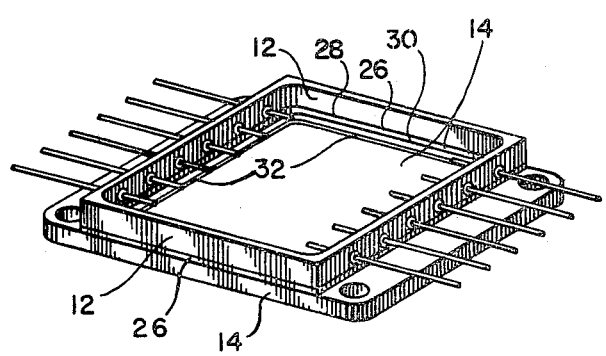

Prior to forming the sandwich structure, the frame is bored and provided with leads 20 and glass feed-throughs 18 such that after cooling, the completed part takes on the configuration illustrated in FIG. 6. It will be appreciated that the final structure of FIG. 6, however produced, may be overcoated with a gold deposition for the purposes of prevention of contamination or oxidization, with the gold coating the package and leads, but not the feed-throughs.

Whether a one-step or a two-step process is utilized, utilization of the intermediate ring prevents flashing and thus the undesirable leeching, cosmetic defects and unreliable bonds. What has therfore been provided is a method for brazing the individual components of a flat package which results in a reliable bond and good hermeticity while at the same time being cosmetically acceptable.

In summary, the utilization of an intermediary material which has a thermal conductivity at least higher than that of the lowest thermal conductivity material permits brazing of the materials together without substantial flashing.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A flat pack carrier for housing electronic components comprising a sandwich of a frame of nickel, cobalt, and iron, a first braze layer, a copper ring, a second braze layer, and a base of an alloy of tungsten and copper, said flat pack carrier having been formed in a brazing step which includes the steps of providing a sandwich structure of a frame, a braze, a ring, a braze and a copper tungsten alloy base, raising the temperature of said sandwich structure to the melting point of the braze having the highest melting point, and cooling said sandwich structure below the melting point of the braze having the lowest melting point such that the frame is brazed to the ring, such that the ring is brazed to the base, and such that the braze does not flash out over the base during brazing due to the higher thermal conductivity of said ring and base and because the base and ring reach the same temperature at substantially the same time during the brazing process.

2. A method of preventing flashing in an all metal flat pack carrier when a frame having a lower thermal conductivity is brazed to a base having a higher thermal conductivity comprising the steps of positioning a member having a thermal conductivity greater than that of the part having the lower thermal conductivity between the parts and brazing parts and member together, said brazing step including the steps of providing a sandwich structure of said frame, a first layer of braze, said member, a second layer of braze, and said base.

3. The method of claim 2 wherein said brazing step includes the steps of providing a first sandwich structure of one part, a first layer of braze and said member, subjecting said first sandwich structure to a temperature equal to that at which said first layer of braze melts, cooling said first sandwich structure below the first braze layer melting point, providing a second sandwich structure of said first sandwich structure, a second layer of braze, and the other part, subjecting said second sandwich structure to a temperature at which said second layer of braze melts, and cooling said second sandwich structure below the second braze layer melting point.

4. The method of claim 3 wherein said temperatures are the same.

5. The method of claim 2 wherein said lower thermal conductivity part is a glass sealing alloy.

6. The method of claim 2 wherein said higher thermal conductivity part is a material containing tungsten and copper.

7. The method of claim 2 wherein said member is copper.

8. The method of claim 2 wherein said lower thermal conductivity part is a material containing nickel, cobalt, and iron, wherein said member is nickel-clad copper, and wherein said higher thermal conductivity part is nickel-clad material containing tungsten and copper.

* * * * *